United States Patent
Park et al.

(10) Patent No.: US 8,264,301 B2
(45) Date of Patent: Sep. 11, 2012

(54) MODELING CIRCUIT OF HIGH-FREQUENCY DEVICE AND MODELING METHOD THEREOF

(75) Inventors: Ill Kyoo Park, Seoul (KR); Chan Seo Park, Seoul (KR); Myoung Gyun Kim, Seoul (KR); Tae Yeoul Yun, Seoul (KR); Zhe Jun Jin, Seoul (KR); Hyuk Sun, Seoul (KR); Young Duk Yoo, Gyunggi-Do (KR)

(73) Assignees: Samsung Electro-Mechanics Co., Ltd., Gyunggi-do (KR); Industry-University Cooperation Foundation Hanyang University, Seoul (KR)

( * ) Notice: Subject to any disclaimer, the term of this patent is extended or adjusted under 35 U.S.C. 154(b) by 598 days.

(21) Appl. No.: 12/544,802

(22) Filed: Aug. 20, 2009

(65) Prior Publication Data

US 2010/0161291 A1 Jun. 24, 2010

(30) Foreign Application Priority Data

Dec. 23, 2008 (KR) .................. 10-2008-0132664

(51) Int. Cl.
 *H03H 7/00* (2006.01)
(52) U.S. Cl. ..................... 333/172; 333/175
(58) Field of Classification Search .............. 333/172, 333/175, 24 R; 703/2, 14, 23, 24
See application file for complete search history.

(56) References Cited

U.S. PATENT DOCUMENTS

| | | | |
|---|---|---|---|
| 7,268,560 B2 * | 9/2007 | Hsu et al. | 324/534 |
| 7,667,555 B2 * | 2/2010 | Itoh et al. | 333/118 |
| 2010/0217576 A1 * | 8/2010 | Bharath et al. | 703/14 |
| 2010/0276809 A1 * | 11/2010 | Ding et al. | 257/773 |

FOREIGN PATENT DOCUMENTS

KR 1020070066051 A 6/2007

* cited by examiner

*Primary Examiner* — Dean O. Takaoka
*Assistant Examiner* — Alan Wong
(74) *Attorney, Agent, or Firm* — Lowe, Hauptman, Ham & Berner, LLP (57) ABSTRACT

There are provided a modeling circuit of a high-frequency device capable of providing a more accurate modeling circuit having a higher-order resonance by dividedly modeling an overlap zone and a non-overlap zone of the high-frequency device, and a modeling method thereof. The modeling circuit of a high-frequency device, which comprises an overlap zone where the two electrodes are overlapped with each other, a non-overlap zone where the overlap zone is absent between the two electrodes, the overlap and non-overlap zones being formed by stacking two or more electrodes on top of each other in a constant distance, and terminations electrically coupled with some parts of the two electrodes, comprises a first circuit block comprising a first capacitor and a first conductor that model the overlap zone of the high-frequency device on the basis of coupled transmission line theory; and a second circuit block comprising a first inductor and a first register that model the overlap zone of the high-frequency device on the basis of coupled transmission line theory and model the non-overlap zone and the terminations of the high-frequency device on the basis of a Series RL model.

16 Claims, 11 Drawing Sheets

PRIOR ART

MODELING CIRCUIT OF HIGH-FREQUENCY DEVICE AND MODELING METHOD THEREOF

CROSS-REFERENCE TO RELATED APPLICATIONS

This application claims the priority of Korean Patent Application No. 2008-132664 filed on Dec. 23, 2008, in the Korean Intellectual Property Office, the disclosure of which is incorporated herein by reference.

BACKGROUND OF THE INVENTION

1. Field of the Invention

The present invention relates to a modeling circuit and a modeling method thereof, and more particularly, to a modeling circuit of a high-frequency device capable of providing a more accurate modeling circuit having a higher-order resonance by dividedly modeling an overlap zone and a non-overlap zone of the high-frequency device, and a modeling method thereof.

2. Description of the Related Art

In recent years, wireless communication systems have been widely used with their advantages such as portability and accessibility.

These wireless communication systems use a radio frequency signal to process information. For this purpose, a high frequency circuit for processing a radio frequency signal is used in the wireless communication systems.

Devices determining electrical characteristics of circuits are used in the above-mentioned high frequency circuit, and an inductor, a capacitor, a transmission line and the like are used as these devices.

For example, a multi-layer ceramic capacitor (MLCC) used in processes such as impedance matching and filtering is used in the above-mentioned high frequency circuit. When high-frequency devices such as a multi-layer chip capacitor are driven at a high frequency bandwidth, an accurate and reliable modeling circuit is required due to a variety of electrical characteristics such as parasitic capacitance, parasitic inductance, etc.

Also, when high-frequency devices are driven within high frequency, the high-frequency devices show characteristics such as self resonance frequency. Also when the high-frequency devices are driven at a higher frequency bandwidth higher, than self resonance frequency, the high-frequency devices show a second or higher resonance at a higher-order resonance frequency. Therefore, a modeling circuit, which can accurately show characteristics such as higher order frequency response functions, is required.

SUMMARY OF THE INVENTION

An aspect of the present invention provides a modeling circuit of a high-frequency device capable of providing a more accurate modeling circuit having a higher-order resonance by dividedly modeling an overlap zone and a non-overlap zone of the high-frequency device.

Another aspect of the present invention provides a modeling method of the modeling circuit.

According to an aspect of the present invention, there is provided a modeling circuit of a high-frequency device that includes an overlap zone where the two electrodes are overlapped with each other, a non-overlap zone where the overlap zone is absent between the two electrodes, the overlap and non-overlap zones being formed by stacking two or more electrodes on top of each other in a constant distance, and terminations electrically coupled with some parts of the electrodes, the modeling circuit including a first circuit block including a first capacitor and a first conductor that model the overlap zone of the high-frequency device on the basis of coupled transmission line theory; and a second circuit block including a first inductor and a first register that model the overlap zone of the high-frequency device on the basis of coupled transmission line theory and model the non-overlap zone and the terminations of the high-frequency device on the basis of a Series RL model, wherein the first and second circuit blocks are combined to form a primary self resonance of the high-frequency device.

In this case, the first and second circuit blocks may be arranged between first and second ports for inputting/outputting external signals and be coupled in series with the first and second ports, the first capacitor and the first conductor of the first circuit block may be arranged between the first port and the second circuit block and be coupled in parallel with each other, and the first inductor and the first register of the second circuit block may be arranged between the first circuit block and the second port and be coupled in series with each other.

Also, the first capacitor may be formed on the basis of Equation: $C_{1st}=C_m lN$, the first conductor may be formed on the basis of Equation: $G_{1st}=G_m lN$, the first inductor may be formed on the basis of Equation:

$$L_{1st} = \frac{l}{2N}(L_{self} + L_m) + \left(\frac{4l'}{N}L_{self} + 2L_T\right),$$

and the first register may be formed on the basis of Equation:

$$R_{1st} = \frac{l}{2N}(R_{self} + R_m) + \left(\frac{4l'}{N}R_{self} + 2R_T\right),$$

wherein, $C_{1st}$ represents a first capacitor, $C_m$ represents a capacitance per unit distance, l represents a length of an overlap zone, N represents the layer number of stacked electrodes, $G_{1st}$ represents a first conductor, $G_m$ represents conductance per unit distance, $L_{1st}$ represents a first inductor, $L_{self}$ represents self inductance per unit distance, $L_m$ represents inductance per unit distance, $L_T$ represents equivalent inductance of the terminations, l' represents a length of a non-overlap zone, $R_{1st}$ represents a first register, $R_{self}$ represents self resistance per unit distance, $R_m$ represents resistance per unit distance, and $R_T$ represents equivalent resistance of the terminations.

In addition, the high-frequency device may be mounted on a printed circuit board, the printed circuit board may include a signal transmission line having the high-frequency device mounted on one surface thereof and a ground pattern formed in the other surface that is opposite to the one surface thereof, and the modeling circuit may further include first and second substrate circuit blocks that model a parasitic admittance between the high-frequency device and the printed circuit board.

Additionally, the first substrate circuit block may be arranged between the first port and a ground and be coupled in series with the first port and the ground, and the second substrate circuit block is arranged between the second port and a ground and coupled in series with the second port and the ground, and each of the first and second substrate circuit blocks may include a parasitic conductor arranged between the first and second ports and the ground and coupled in series with the first and second ports and the ground; and a parasitic register and a parasitic capacitor arranged between the first and second ports and the ground and coupled in series with the first and second ports and the ground, and coupled in parallel with the parasitic conductor.

Also, the modeling circuit may further include a higher order resonant circuit block having an impedance that models the overlap zone of the high-frequency device on the basis of coupled transmission line theory and forms a second or higher self resonance of the high-frequency device.

In addition, the higher order resonant circuit block may include a second capacitor formed on the basis of Equation: $C_{2nd}=2C_m lN=2C_{1st}$; a second conductor formed on the basis of Equation: $G_{2nd}=2G_m lN=2G_{1st}$; a second inductor formed on the basis of Equation:

$$L_{2nd} = \frac{l}{6N}(L_{self} - L_m);$$

and a second register formed on the basis of Equation:

$$R_{2nd} = \frac{l}{6N}(R_{self} - R_m),$$

wherein, $C_{2nd}$ represents a second capacitor, $C_m$ represents capacitance per unit distance, l represents a length of an overlap zone, N represents the layer number of stacked electrodes, $C_{1st}$ represents a first capacitor, $G_{2nd}$ represents a second conductor, $G_m$ represents conductance per unit distance, $G_{1st}$ represents a first conductor, $L_{2nd}$ represents a second inductor, $L_{self}$ represents self inductance per unit distance, $L_m$ represents inductance per unit distance, $R_{2nd}$ represents a second register, $R_{self}$ represents self resistance per unit distance, and $R_m$ represents resistance per unit distance.

Additionally, the higher order resonant circuit block may be arranged between the second circuit block and the second port and be coupled in series with the second circuit block and the second port, the second inductor and the second register may be coupled in series with each other, and the second inductor and the second register, the second capacitor, and the second conductor may be arranged between the second circuit block and the second port and be coupled in parallel with each other.

Furthermore, the capacitance per unit distance may be calculated on the basis of Equation: $C_m=C_{1st}/lN$, the conductance per unit distance may be calculated on the basis of Equation: $G_m=G_{1st}/lN$, the self resistance per unit distance may be calculated on the basis of Equation: $R_{self}=(6N/l)R_{2nd}$, the inductance per unit distance may be calculated on the basis of Equation:

$$L_m = L_{self} - \frac{6N}{l}L_{2nd},$$

the equivalent resistance of the electrodes may be calculated on the basis of Equation:

$$R_T = \frac{1}{2}\left\{R_{1st} - \left(\frac{l}{2N} + \frac{4l'}{N}\right)R_{self}\right\},$$

and the equivalent inductance of the electrodes may be calculated on the basis of Equation:

$$L_T = \frac{L_{1st}}{2} + \frac{3}{2}L_{2nd} - \left(\frac{l+4l'}{2N}\right)L_{self},$$

wherein, $C_{1st}$ represents a first capacitor, $C_m$ represents capacitance per unit distance, l represents a length of an overlap zone, N represents the layer number of stacked electrodes, $G_{1st}$ represents a first conductor, $G_m$ represents conductance per unit distance, $R_{self}$ represents self resistance per unit distance, $R_{2nd}$ represents a second register, $L_{2nd}$ represents a second inductor, $L_{self}$ represents self inductance per unit distance, $L_m$ represents inductance per unit distance, $L_T$ represents equivalent inductance of the terminations, l' represents a length of a non-overlap zone, and $R_T$ represents equivalent resistance of the terminations.

According to another aspect of the present invention, there is provided a method for modeling a high-frequency device that includes an overlap zone where the two electrodes are overlapped with each other, a non-overlap zone where the overlap zone is absent between the two electrodes, the overlap and non-overlap zones being formed by stacking two or more electrodes on top of each other in a constant distance, and terminations electrically coupled with some parts of the two electrodes. Here, the method includes: modeling the overlap zone of the high-frequency device on the basis of coupled transmission line theory, and the non-overlap zone and the terminations of the high-frequency device on the basis of a Series RL model; and extracting each parameter of the modeled circuits from actually measured self resonance frequency of the high-frequency device to substitute the each parameter to the modeled circuits.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
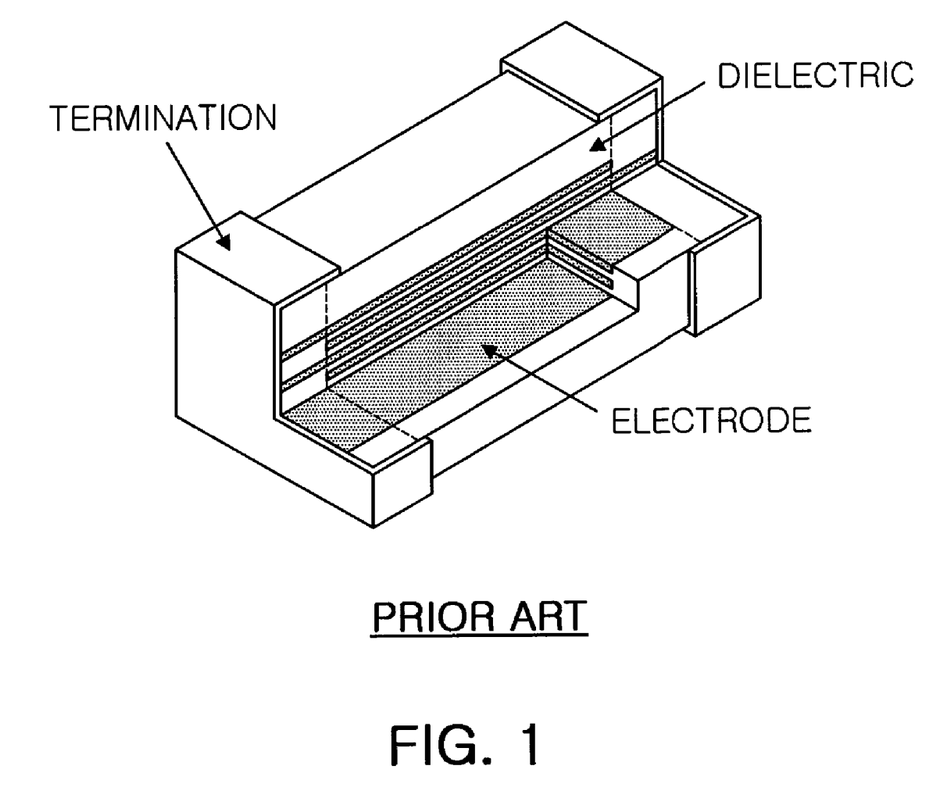
FIG. 1 is a cross cut diagram illustrating a conventional high-frequency device.

FIG. 1 is a cross cut diagram illustrating a conventional high-frequency device.

Referring to FIG. 1, a conventional high-frequency device, particularly a multi-layer ceramic capacitor (MLCC) is formed of dielectric, and has a plurality of electrodes stacked on top thereof. Here, the electrodes are electrically coupled with terminations formed outside the dielectric, respectively.

Figure 2:
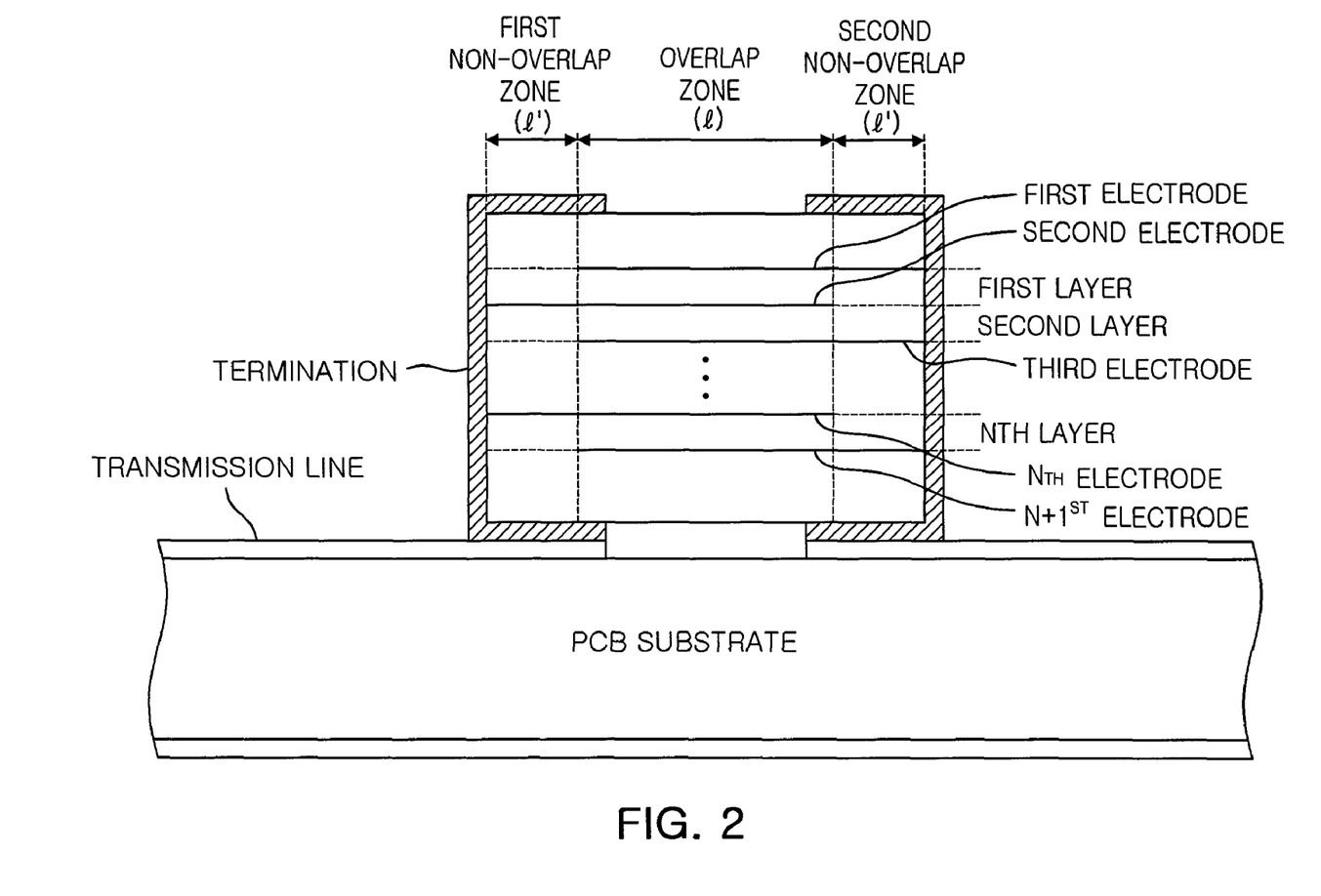
FIG. 2 is a cross-sectional view illustrating a high-frequency device having divided zones according to one exemplary embodiment of the present invention.

FIG. 2 is a cross-sectional view illustrating a high-frequency device having divided zones according to one exemplary embodiment of the present invention.

Referring to FIG. 2, the high-frequency device thus configured may have a plurality of electrodes (a first electrode to an N+1$^{st}$ electrode) stacked on top thereof. Here, first and second electrodes may be defined as a first layer, and, thus, N$^{th}$ and N+1$^{st}$ electrodes may be defined as an N$^{th}$ layer.

When electrodes are stacked on top of each other, the above-mentioned layers may be divided into an overlap zone (l) and a non-overlap zone (l'). Here, each of the layers may be electrically coupled with one of the terminations.

Also, the above-mentioned high-frequency device may be mounted on a transmission line formed on a printed circuit board (PCB). In this case, a parasitic admittance may be present between the high-frequency device and the printed circuit board.

That is to say, the high-frequency device according to one exemplary embodiment of the present invention may be divided into an overlap zone, a non-overlap zone, terminations and a parasitic admittance, depending on the electrical characteristics.

Therefore, respective parts of the high-frequency device may be modeled to form a modeling circuit as described later.

Figure 3:
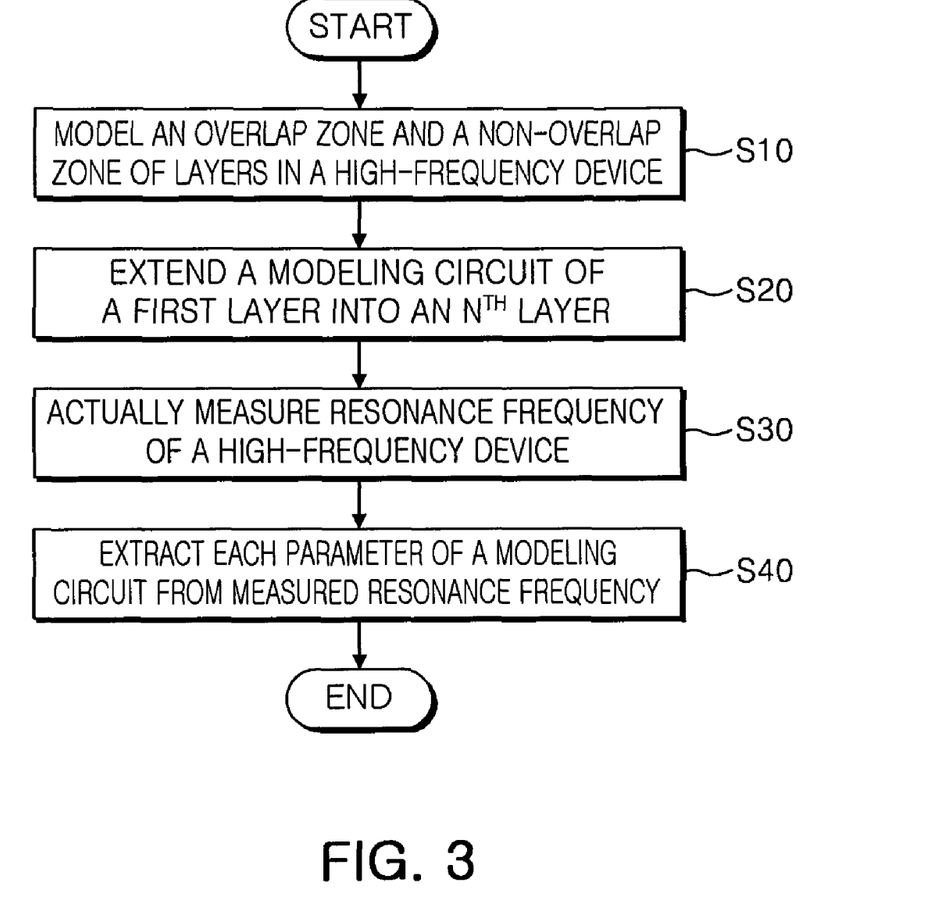
FIG. 3 is a flowchart illustrating a modeling method according to one exemplary embodiment of the present invention.

FIG. 3 is a flowchart illustrating a modeling method according to one exemplary embodiment of the present invention.

Referring to FIG. 3, for the modeling method according to one exemplary embodiment of the present invention, an overlap zone of the high-frequency device is first modeled on the basis of coupled transmission line theory, and a non-overlap zone of the high-frequency device is modeled on the basis of a Series RL model (S10). In addition, it is possible to model a parasitic admittance between the high-frequency device and the printed circuit board.

Next, a modeling circuit applied to a first layer is extended into the whole layers (S20), a self resonance frequency (SRF) of the high-frequency device is measured (S30), and each of the parameters of the extended modeling circuit are extracted to complete a modeling circuit (S40).

The above-mentioned modeling method is described in more detail with reference to the accompanying drawings.

Figure 4A:
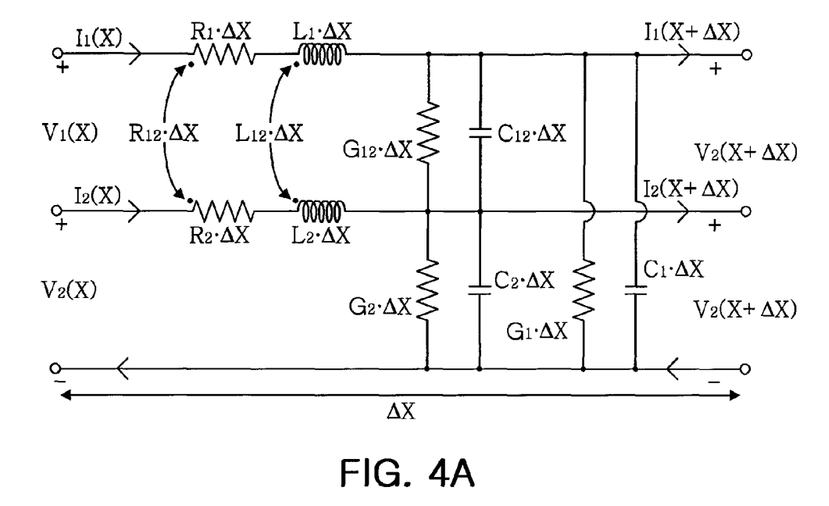
FIGS. 4A to 4C are diagrams illustrating modeling circuits of a high-frequency device using coupled transmission line theory.
Figure 4B:
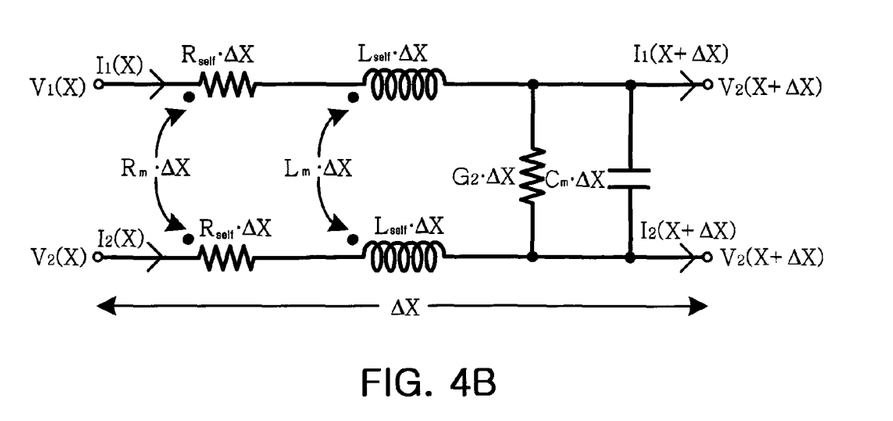
Figure 4C:
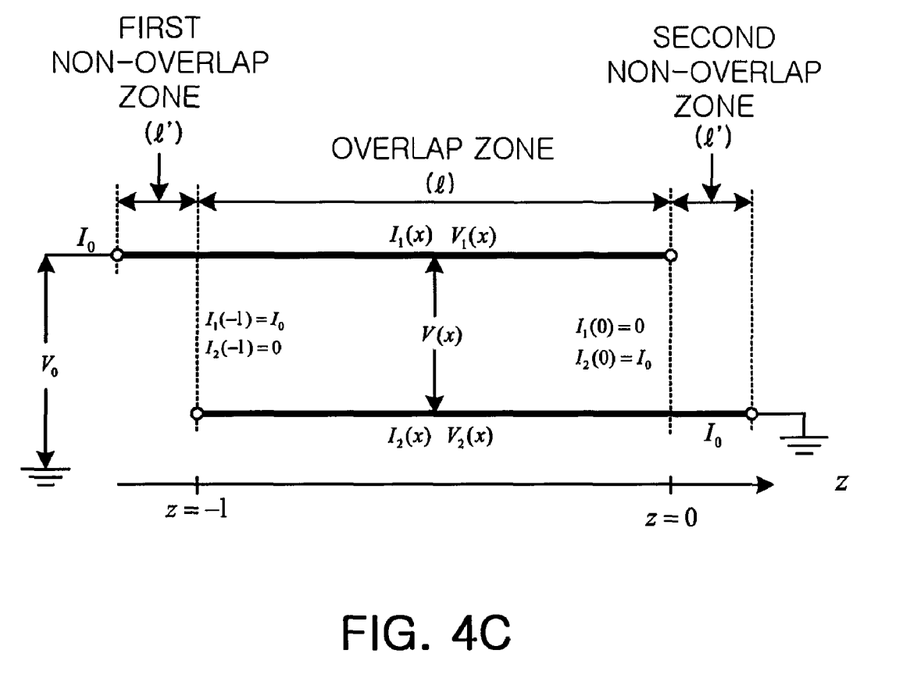

FIGS. 4A to 4C are diagram illustrating modeling circuits of a high-frequency device using coupled transmission line theory.

When the coupled transmission line theory applies to the first layer, a modeling circuit may be shown as in FIG. 4A. That is, when it is assumed that each of the first and second electrodes is referred to as one transmission line, the first and second electrodes are arranged electrically close to each other, which makes it possible to apply the coupled transmission line theory to the first layer.

Each of the first and second electrodes has resistances (R1 and R2) and inductances (L1 and L2) within a predetermined unit length (Δx). Here, coupling inductance (L12), coupling resistance (R12), conductance (G12) and capacitance (C12) are present between the first and the second electrodes. Also, conductance (G1) and capacitance (C1) are present between the first electrodes and a ground, and conductance (G2) and capacitance (C2) are present between the second electrodes and the ground.

The above-mentioned electrical parameters in a time domain may be defined as currents (I1 and I2) and voltages (V1 and V2) according to the Telegrapher's Equation, as follows.

$$\frac{d}{dx}\begin{bmatrix}V_1(x)\\V_2(x)\end{bmatrix} = -\begin{bmatrix}R_1 & R_{12}\\R_{12} & R_2\end{bmatrix}\begin{bmatrix}I_1(x)\\I_2(x)\end{bmatrix} - j\omega\begin{bmatrix}L_1 & L_{12}\\L_{12} & L_2\end{bmatrix}\begin{bmatrix}I_1(x)\\I_2(x)\end{bmatrix} \quad \text{Equation 1}$$

$$\frac{d}{dx}\begin{bmatrix}I_1(x)\\I_2(x)\end{bmatrix} = \begin{bmatrix}-(G_1+G_{12}) & G_{12}\\G_{12} & -(G_2+G_{12})\end{bmatrix}\begin{bmatrix}V_1(x)\\V_2(x)\end{bmatrix} - j\omega\begin{bmatrix}C_1+C_{12} & -C_{12}\\C_{12} & C_2+C_{12}\end{bmatrix}\begin{bmatrix}V_1(x)\\V_2(x)\end{bmatrix} \quad \text{Equation 2}$$

Since the grounds are arranged in a more remote distance than a gap between the first and second electrodes in the case of the modeling circuit as shown in FIG. 4A, it may be considered that an electrical effect of the grounds on each electrode is slightly taken, compared to that between the first and second electrodes. Therefore, since the conductances (G1 and G2) and capacitances (C1 and C2) are ignorably low, the modeling circuit where there is no electrical effect of the grounds may be shown as in FIG. 4B. On the basis of the modeling circuit according to the coupled transmission line theory as shown in FIG. 4B, a modeling circuit of the first layer may be shown as in FIG. 4C.

That is, when a voltage (Vo) is applied to a capacitor of the first layer, an electrical circuit of the capacitor is shown in FIG. 4C. Currents (I1 and I2) flow when a voltage (Vo) is applied to the capacitor. As a length (x) increases, the current (I1) in the first electrode gradually decreases from Io to 0, and the current (I2) in the second electrode gradually increases from 0 to Io.

Also, it may be defined that the current at the starting point of the first electrode and the current at the end point of the second electrode have the same capacity as Io, and that the sum (I1 and I2) of current at each unit length has the same capacity as Io.

Therefore, an impedance (Zoverlap) in the overlap zone may be calculated as represented by the following Equation 3.

$$Z_{Overlap} = \frac{l}{2} \cdot (Z+Z_M) + \frac{(Z-Z_M)}{\gamma} \cdot \left(\frac{1+\cosh\gamma l}{\sinh\gamma l}\right) \quad \text{Equation 3}$$

$$Z = Rself + j\omega Lself = R1 + j\omega L1 = R2 + j\omega L2,$$

$$ZM = Rm + j\omega Lm = R12 + j\omega L12,$$

$$\gamma 2 = 2YM(Z-ZM), YM = Cm + j\omega Gm.$$

wherein l represents a length of an overlap zone, sin h (rl) and cos h (rl) may be interpreted according to the Maclaurin series, as follows.

$$\sinh(\gamma l) = (\gamma l) + \frac{1}{6}(\gamma l)^3 + \frac{1}{120}(\gamma l)^5 + \ldots$$

$$\cosh(\gamma l) = 1 + \frac{1}{2}(\gamma l)^2 + \frac{1}{24}(\gamma l)^4 + \ldots$$

Also, an impedance (Znon-overlap) in the non-overlap zone may be calculated as represented by the following Equation 4.

$$Z_{non\text{-}overlap} = Z \cdot l' \qquad \text{Equation 4}$$

wherein, l' represents a length of a non-overlap zone.

Therefore, an impedance (Zcap_1-layer) of the first layer is calculated as represented by the following Equation 5.

$$Z_{cap\_1\text{-}layer} = 2Z_T + (Z_{overlap} + 2Z_{non\text{-}overlap}) \qquad \text{Equation 5}$$

wherein, ZT represents impedance of the terminations, and may be represented by Equation: $Z_T = R_T + j\omega L_T$, by using the loss of the terminations and the impedance.

Figure 5A:
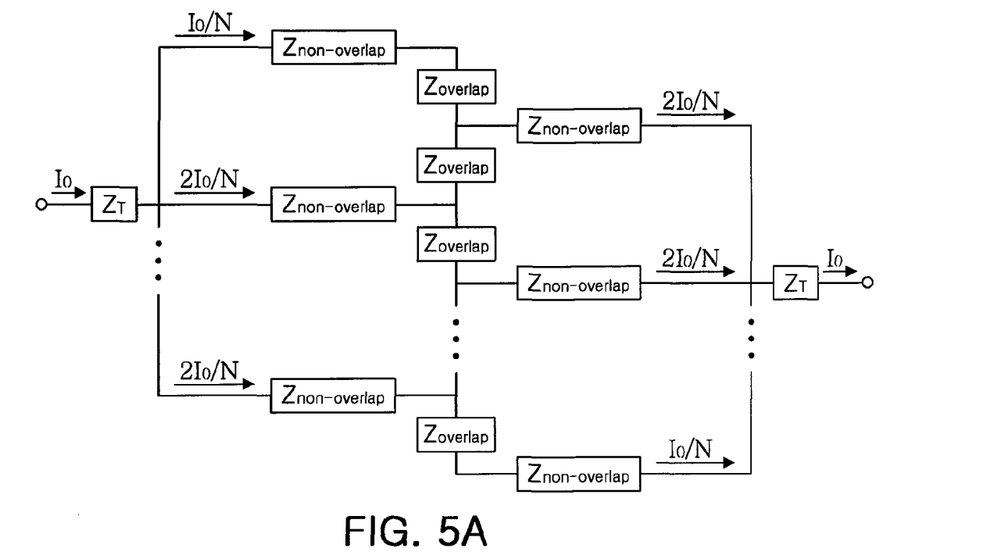
FIGS. 5A and 5B are diagrams illustrating exploded models of modeling circuits of a high-frequency device according to one exemplary embodiment of the present invention.
Figure 5B:
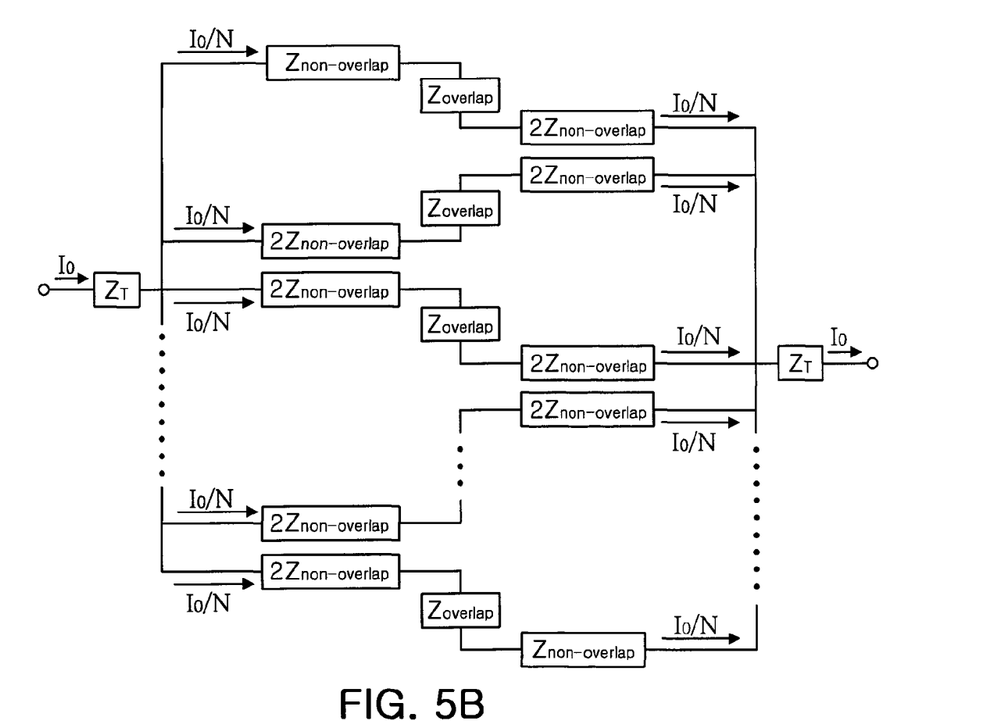

The modeling circuit in the above-mentioned first layer may be extended into the first layer to an $N^{th}$ layer, as shown in FIG. 5A, and may have a parallel electrical configuration as shown in FIG. 5B when the overlap zone (Zoverlap) and the non-overlap zone (Znon-overlap) have the same electric potential at their junction.

The electrical configuration as shown in FIG. 5B may be represented by the following Equation 6.

$$Z_{cap\_N\text{-}layer} = 2Z_T + \left(\frac{Z_{overlap} + 3Z_{non\text{-}overlap}}{2}\right) // \qquad \text{Equation 6}$$

$$\left(\frac{Z_{overlap} + 4Z_{non\text{-}overlap}}{N-2}\right) \approx \frac{Z_{overlap}}{N} + 4\frac{Z_{non\text{-}overlap}}{N} + 2Z_T$$

The following Equation 7 is presented by substituting the Equation 6 for the above-mentioned Equations 3 and 4.

$$Z_{cap\_N\text{-}layer} = \qquad \text{Equation 7}$$

$$\frac{l}{2N}(Z + Z_M) + \frac{(Z - Z_M)}{\gamma N}\left(\frac{1 + \cosh\gamma l}{\sinh\gamma l}\right) + 4\frac{Zl'}{N} + 2Z_T$$

Figure 6A:
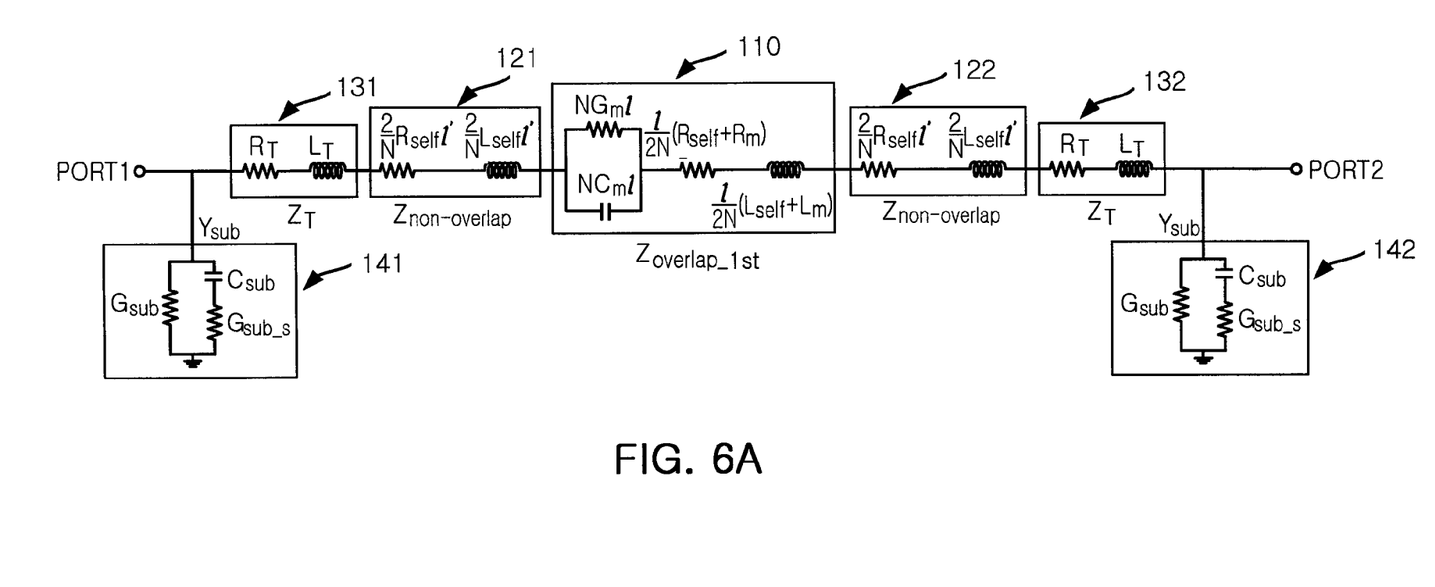
FIGS. 6A and 6B are diagrams illustrating modeling circuits of a high-frequency device according to one exemplary embodiment of the present invention.
Figure 6B:
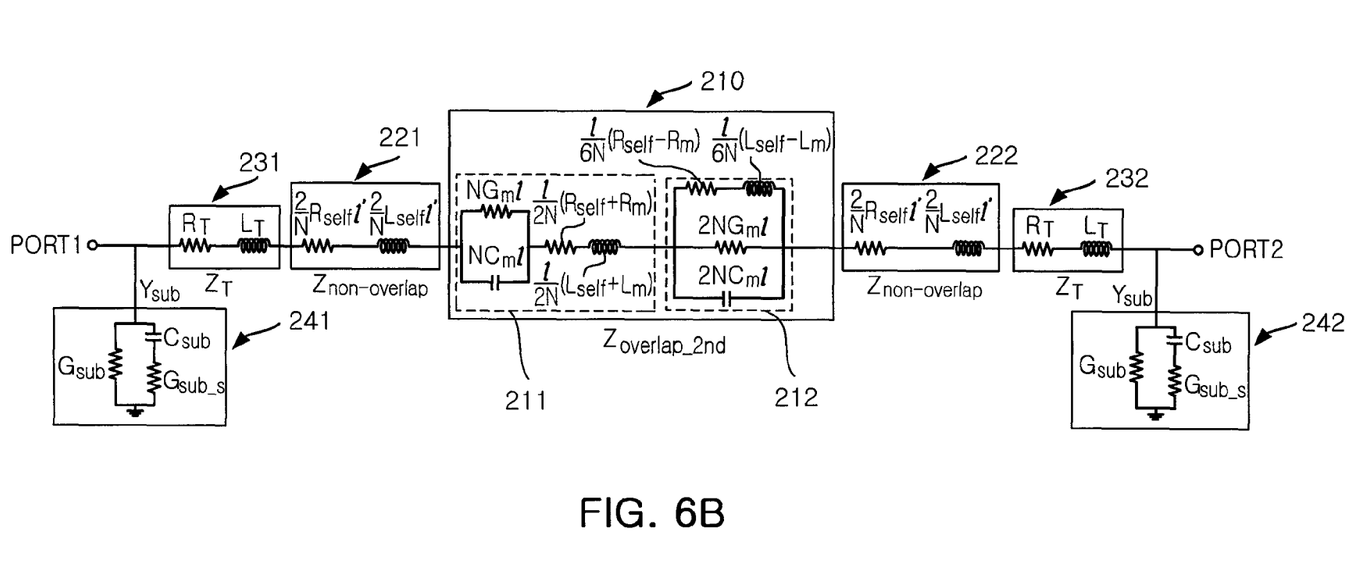

As shown in FIG. 6A, a first-order modeling circuit of the high-frequency device according to one exemplary embodiment of the present invention may be obtained by substituting linear terms of sin h (rl) and cos h (rl) for the above-mentioned Equation 7, and, as shown in FIG. 6B, a second-order modeling circuit of the high-frequency device according to one exemplary embodiment of the present invention may be obtained by substituting linear and quadratic terms of sin h (rl) and cos h (rl) for the above-mentioned Equation 7.

Figure 7A:
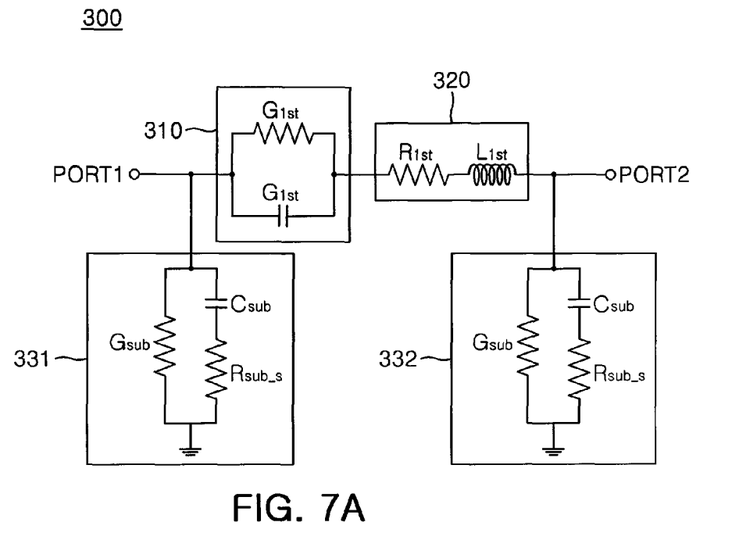
FIGS. 7A and 7B are diagrams illustrating finally assembled modeling circuits of a high-frequency device according to one exemplary embodiment of the present invention.
Figure 7B:
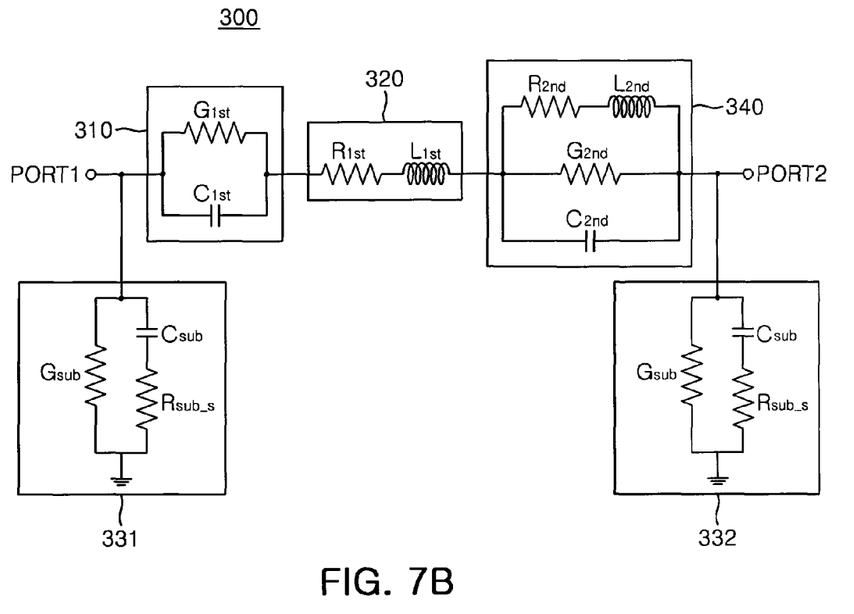

Here, modeled circuits 110 and 210 of the overlap zone and modeled circuits 121, 122, 221 and 222 of the non-overlap zone, a first-order self resonance frequency modeling circuit 211 of the overlap zone, a second-order self resonance frequency modeling circuit 212 of the overlap zone, termination-modeled circuits 131, 132, 231 and 232, and substrate-modeled circuits 141, 142, 241 and 242 may be defined to obtain a finally assembled modeling circuits, as shown in FIGS. 7A and 7B.

Here, a first capacitor ($C_{1st}$) of a first circuit block 310 may be formed on the basis of Equation: $C_{1st} = C_m l N$, and a first conductor ($G_{1st}$) may be formed on the basis of Equation: $G_{1st} = G_m l N$. Also, a first inductor ($L_{1st}$) of a second circuit block 320 may be formed on the basis of Equation:

$$L_{1st} = \frac{l}{2N}(L_{self} + L_m) + \left(\frac{4l'}{N}L_{self} + 2L_T\right),$$

and a first register ($R_{1st}$) may be formed on the basis of Equation:

$$R_{1st} = \frac{l}{2N}(R_{self} + R_m) + \left(\frac{4l'}{N}R_{self} + 2R_T\right).$$

Here, $C_{1st}$ represents a first capacitor, $C_m$ represents capacitance per unit distance, l represents a length of an overlap zone, N represents the layer number of stacked electrodes, $G_{1st}$ represents a first conductor, $G_m$ represents measured conductance per unit distance, $L_{1st}$ represents a first inductor, $L_{self}$ represents self inductance per unit distance, $L_m$ represents inductance per unit distance, $L_T$ represents equivalent inductance of the terminations, l' represents a length of a non-overlap zone, $R_{1st}$ represents a first register, $R_{self}$ represents self resistance per unit distance, $R_m$ represents resistance per unit distance, and $R_T$ represents equivalent resistance of the terminations.

Each of the above-mentioned parameters of the modeling circuit may be extracted by measurement of the first-order self resonance of the high-frequency device.

That is, the above-mentioned modeling circuit may be calculated as represented by the following Equation 8.

$$Z_1(\omega) = \left(\frac{G_{1st}}{G_{1st}^2 + \omega^2 C_{1st}^2} + R_{1st}\right) + j\omega\left(L_{1st} - \frac{C_{1st}}{G_{1st}^2 + \omega^2 C_{1st}^2}\right) \qquad \text{Equation 8}$$

First of all, the difference between theoretical capacitance and actually measured capacitance of products is not so high with the development of technologies of manufacturing a capacitor. In this case, the theoretical capacitance of the products may apply to the first capacitor ($C_{1st}$).

Next, when a frequency is set to 0, the conductance of the first conductor ($G_{1st}$) may be extracted from a real component of the impedance ($Z_1(\omega)$). That is, when a frequency is set to a very low range, a current unavoidably flows through the conductance of the first conductor ($G_{1st}$), and a reciprocal value of the first conductor ($G_{1st}$) is not as high as the conductance of the first resister ($R_{1st}$) is ignored when a frequency is set to 0.

Also, since an imaginary component of the impedance ($Z_1(\omega)$) at a primary resonance frequency is 0, the resistance of the first register ($R_{1st}$) at the primary resonance frequency may be extracted from a real component of the impedance ($Z_1(\omega)$). On the assumption that the imaginary component of the impedance ($Z_1(\omega)$) at the primary resonance frequency is set to 0, the inductance of the first inductor ($L_{1st}$) may be extracted in the same manner as described above.

Each of the parameters thus extracted may be presented, as follows.

$$C_{1st} \approx \text{Capacitance of Product}$$

$$R_{1st} \approx \text{Re}\{Z_1(\omega)\}_{\omega=\omega_{1st}},$$

$$L_{1st} = \frac{C_{1st}}{G_{1st}^2 + \omega_{1st}^2 C_{1st}^2} \approx \frac{1}{\omega_{1st}^2 \cdot C_{1st}^2}$$

-continued $$G_{1st} \approx \text{Re}\{Z_1(\omega)\}^{-1}|_{\omega=0}$$

Each of the first and second substrate circuit blocks 331 and 332 has a parasitic admittance between the high-frequency device and the printed circuit board. Here, each of the first and second substrate circuit blocks 331 and 332 may include a parasitic conductor (Gsub) arranged between the first and second ports (port1 and port2) and the ground and coupled in series with the first and second ports (port1 and port2) and the ground, and a parasitic register (Rsub) and a parasitic capacitor (Csub) arranged between the first and second ports (port1 and port2) and the ground and coupled in series with each other, and coupled in parallel with the parasitic conductor (Gsub). The above-mentioned parasitic admittance extraction method is known to those skilled in the art, and therefore its detailed description is omitted for clarity.

Also, a second capacitor ($C_{2nd}$) of the higher order resonant circuit block 340 as shown in FIG. 7B may be formed on the basis of Equation: $C_{2nd}=2C_m lN=2C_{1st}$; second conductor ($G_{2nd}$) may be formed on the basis of Equation: $G_{2nd}=2G_m lN=2G_{1st}$; a second inductor ($L_{2nd}$) may be formed on the basis of Equation:

$$L_{2nd} = \frac{l}{6N}(L_{self} - L_m);$$

and a second register ($R_{2nd}$) may be formed on the basis of Equation:

$$R_{2nd} = \frac{l}{6N}(R_{self} - R_m),$$

wherein, C2nd represents a second capacitor, $C_m$ represents capacitance per unit distance, l represents a length of an overlap zone, N represents the layer number of stacked electrodes, $C_{1st}$ represents a first capacitor, $G_{2nd}$ represents a second conductor, $G_m$ represents conductance per unit distance, $G_{1st}$ represents a first conductor, $L_{2nd}$ represents a second inductor, $L_{self}$ represents self inductance per unit distance, $L_m$ represents inductance per unit distance, $R_{2nd}$ represents a first register, $R_{self}$ represents self resistance per unit distance, and $R_m$ represents resistance per unit distance.

On the basis of the above-mentioned equations, the capacitance ($C_m$) per unit distance, the conductance ($G_m$) per unit distance, the self resistance ($R_{self}$) per unit distance, the inductance ($L_m$) per unit distance, the equivalent resistance ($R_T$) of the terminations, and the equivalent inductance ($L_T$) of the terminations may be calculated, as follows.

That is, the capacitance ($C_m$) per unit distance may be calculated on the basis of Equation: $C_m=C_{1st}/lN$, the conductance ($G_m$) per unit distance may be calculated on the basis of Equation: $G_m=G_{1st}/lN$, the self resistance ($R_{self}$) per unit distance may be calculated on the basis of Equation: $R_{self}=(6N/l)R_{2nd}$, and the inductance ($L_m$) per unit distance may be calculated on the basis of Equation:

$$L_M = L_{self} - \frac{6N}{l}L_{2nd}.$$

Also, the equivalent resistance ($R_T$) of the terminations may be calculated on the basis of Equation:

$$R_T = \frac{1}{2}\left\{R_{1st} - \left(\frac{l}{2N} + \frac{4l'}{N}\right)R_{self}\right\},$$

and the equivalent inductance ($L_T$) of the terminations may be calculated on the basis of Equation:

$$L_T = \frac{L_{1st}}{2} + \frac{3}{2}L_{2nd} - \left(\frac{l+4l'}{2N}\right)L_{self}.$$

Here, the resistance ($R_m$) per unit distance may be as low as it is ignored, and the self inductance ($L_{self}$) per unit distance may be calculated on the basis of the Ruehil's Self-Inductance Formula, as follows.

$$\frac{L'_{self}}{l} = \frac{\mu}{6\pi}\left[\begin{array}{l} 3\ln(u+\sqrt{u^2+1})+u^2+1/u+ \\ 3u\ln(1/u+\sqrt{1/u^2+1})-\sqrt[3]{u^{4/3}+(1/u)^{2/3}} \end{array}\right]$$

Therefore, the parameters ($C_m$, $G_m$, $L_m$ and $R_{self}$) per unit distance and the parameters ($R_T$ and $L_T$) of the terminations may be calculated from the parameters ($C_{1st}$, $C_{2nd}$, $G_{1st}$, $G_{2nd}$, $R_{1st}$, $R_{2nd}$, $L_{1st}$ and $L_{2nd}$) of the modeling circuit, the inner information (l and N) of the high-frequency device and the self inductance ($L_{self}$) obtained by the Ruehil's Formula.

The measured electrical characteristics of the high-frequency device are compared with those of the modeling circuit to which the extracted parameters are applied according to one exemplary embodiment of the present invention, and the comparison results are shown in FIGS. 8A to 8D.

FIGS. 8A to 8D are diagrams illustrating a modeling circuit of a high-frequency device according to one exemplary embodiment of the present invention, and actually measured electrical characteristics of the high-frequency device.

Figure 8A:
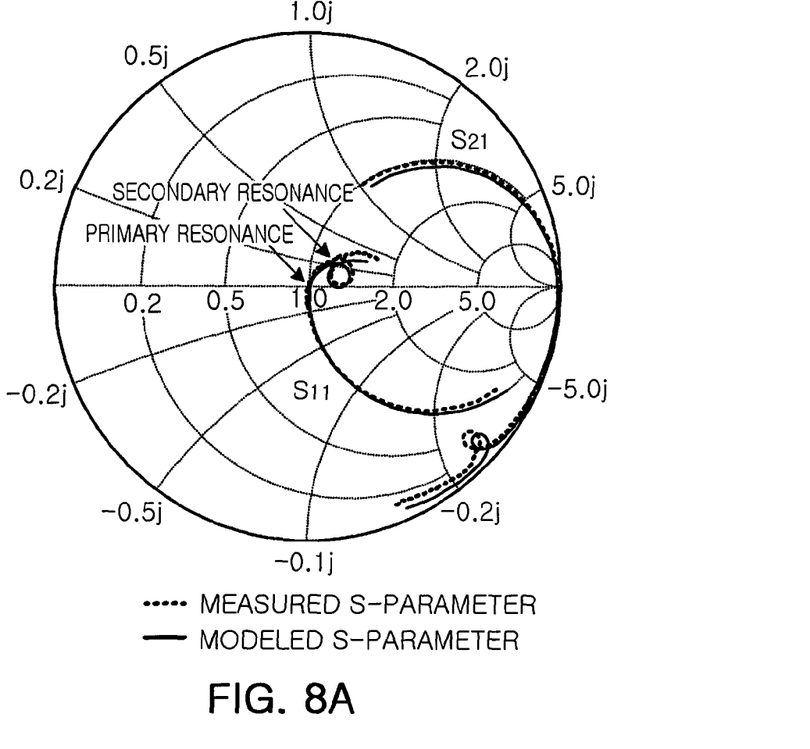
FIGS. 8A to 8D are diagrams illustrating a modeling circuit of a high-frequency device according to one exemplary embodiment of the present invention, and actually measured electrical characteristics of the high-frequency device.
Figure 8B:
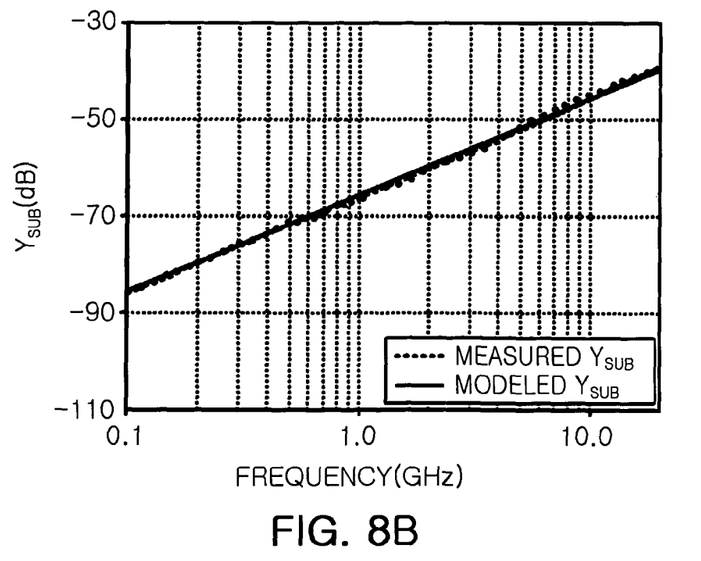

In accordance with the modeling circuit of the high-frequency device according to one exemplary embodiment of the present invention, it may be revealed that a measured S-parameter of the high-frequency device is similar to an S-parameter of the modeled circuit, as shown in FIG. 8A, and that the measured values of parasitic admittance between the high-frequency device and the PCB substrate is similar to the values of the modeled circuit, as shown in FIG. 8B.

Figure 8C:
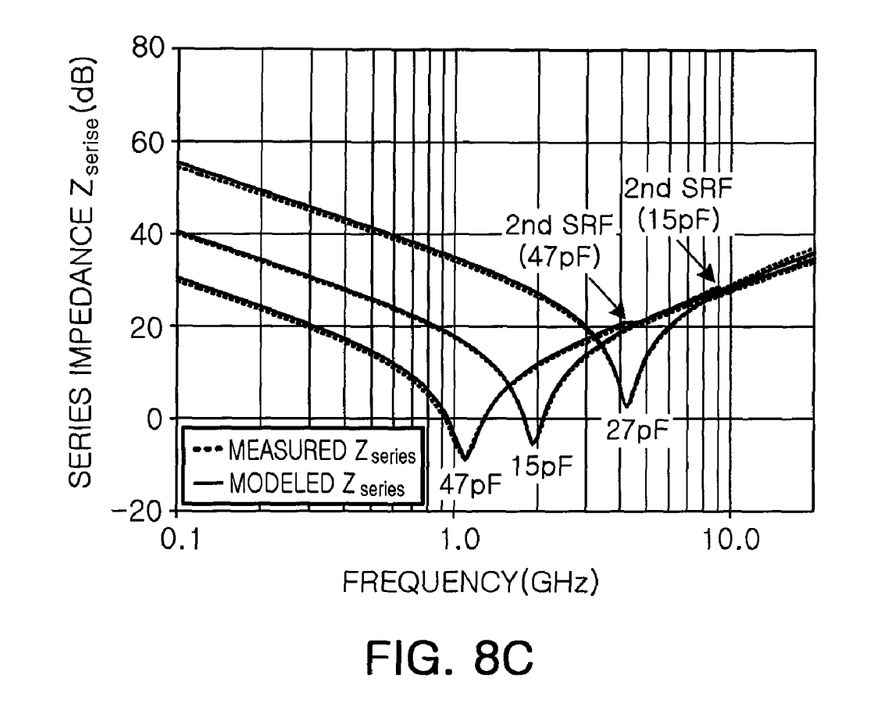
Figure 8D:
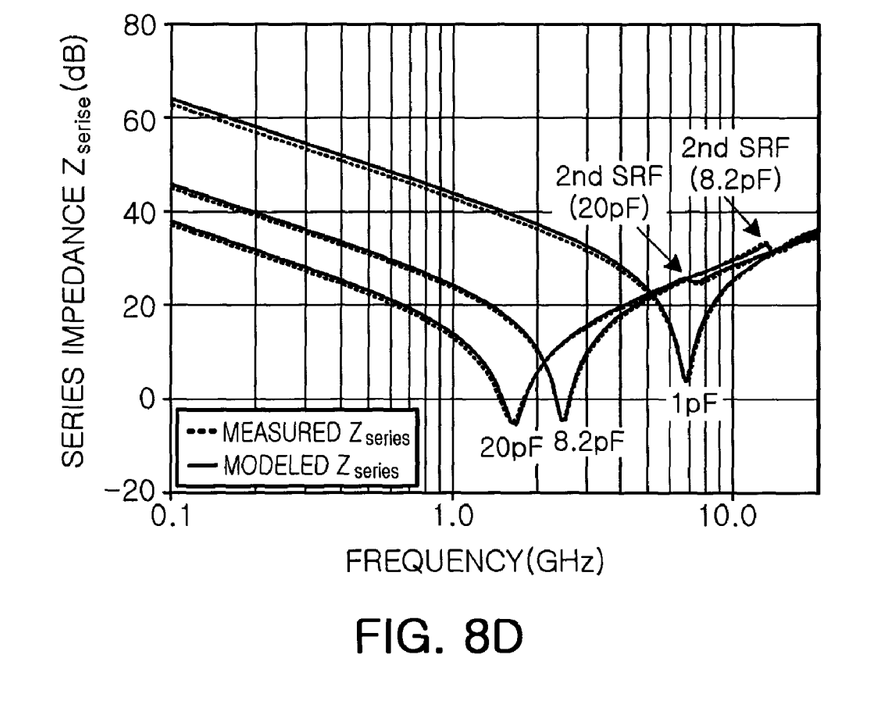

Also, it may be confirmed that the measured second-order self resonance frequency of the high-frequency devices having various capacitances is similar to the values of the modeled circuit, as shown in FIGS. 8C and 8D. Therefore, it may be seen that the modeling circuit according to one exemplary embodiment of the present invention may accurately model the high-frequency device.

As described above, the modeling circuit of a high-frequency device according to one exemplary embodiment of the present invention may be useful to provide a more accurate modeling circuit having a higher-order resonance by dividedly modeling an overlap zone and a non-overlap zone of the high-frequency device.

While the present invention has been shown and described in connection with the exemplary embodiments, it will be apparent to those skilled in the art that modifications and variations can be made without departing from the spirit and scope of the invention as defined by the appended claims.

What is claimed is:

1. A modeling circuit of a high-frequency device that comprises an overlap zone where the two electrodes are overlapped with each other, a non-overlap zone where the overlap zone is absent between the two electrodes, the overlap and non-overlap zones being formed by stacking two or more electrodes on top of each other in a constant distance, and terminations electrically coupled with some parts of the two electrodes, comprising:

a first circuit block comprising a first capacitor and a first conductor that model the overlap zone of the high-frequency device on the basis of coupled transmission line theory; and a second circuit block comprising a first inductor and a first register that model the overlap zone of the high-frequency device on the basis of coupled transmission line theory and model the non-overlap zone and the terminations of the high-frequency device on the basis of a Series RL model, wherein the first and second circuit blocks are combined to form a primary self resonance of the high-frequency device.

2. The modeling circuit of claim 1, wherein the first and second circuit blocks are arranged between first and second ports for inputting/outputting external signals and coupled in series with the first and second ports, the first capacitor and the first conductor of the first circuit block are arranged between the first port and the second circuit block and coupled in parallel with each other, and the first inductor and the first register of the second circuit block are arranged between the first circuit block and the second port and coupled in series with each other.

3. The modeling circuit of claim 2, wherein the first capacitor is formed on the basis of Equation: $C_{1st}=C_m lN$, the first conductor is formed on the basis of Equation: $G_{1st}=G_m lN$, the first inductor is formed on the basis of Equation:

$$L_{1st} = \frac{l}{2N}(L_{self} + L_m) + \left(\frac{4l'}{N}L_{self} + 2L_T\right),$$

and the first register is formed on the basis of Equation:

$$R_{1st} = \frac{l}{2N}(R_{self} + R_m) + \left(\frac{4l'}{N}R_{self} + 2R_T\right),$$

wherein, $C_{1st}$ represents a first capacitor, $C_m$ represents a capacitance per unit distance, l represents a length of an overlap zone, N represents the layer number of stacked electrodes, $G_{1st}$ represents a first conductor, $G_m$ represents conductance per unit distance, $L_{1st}$ represents a first inductor, $L_{self}$ represents self inductance per unit distance, $L_m$ represents inductance per unit distance, $L_T$ represents equivalent inductance of the terminations, l' represents a length of a non-overlap zone, $R_{1st}$ represents a first register, $R_{self}$ represents self resistance per unit distance, $R_m$ represents resistance per unit distance, and $R_T$ represents equivalent resistance of the terminations.

4. The modeling circuit of claim 2, wherein the high-frequency device is mounted on a printed circuit board, the printed circuit board comprises a signal transmission line having the high-frequency device mounted on one surface thereof and a ground pattern formed in the other surface that is opposite to the one surface thereof, and the modeling circuit further comprises first and second substrate circuit blocks that model a parasitic admittance between the high-frequency device and the printed circuit board.

5. The modeling circuit of claim 4, wherein the first substrate circuit block is arranged between the first port and a ground and coupled in series with the first port and the ground, and the second substrate circuit block is arranged between the second port and a ground and coupled in series with the second port and the ground, and each of the first and second substrate circuit blocks comprises:

a parasitic conductor arranged between the first and second ports and the ground and coupled in series with the first and second ports and the ground; and a parasitic register and a parasitic capacitor arranged between the first and second ports and the ground and coupled in series with the first and second ports and the ground, and coupled in parallel with the parasitic conductor.

6. The modeling circuit of claim 2, wherein the modeling circuit further comprises a higher order resonant circuit block having impedance that models the overlap zone of the high-frequency device on the basis of coupled transmission line theory and forms a second or higher self resonance of the high-frequency device.

7. The modeling circuit of claim 6, wherein the higher order resonant circuit block comprises:

a second capacitor formed on the basis of Equation: $C_{2nd}=2C_m lN=2C_{1st}$;

a second conductor formed on the basis of Equation: $G_{2nd}=2G_m lN=2G_{1st}$;

a second inductor formed on the basis of Equation:

$$L_{2nd} = \frac{l}{6N}(L_{self} - L_m);$$

and a second register formed on the basis of Equation:

$$R_{2nd} = \frac{l}{6N}(R_{self} - R_m),$$

wherein, $C_{2nd}$ represents a second capacitor, $C_m$ represents capacitance per unit distance, l represents a length of an overlap zone, N represents the layer number of stacked electrodes, $C_{1st}$ represents a first capacitor, $G_{2nd}$ represents a second conductor, $G_m$ represents conductance per unit distance, $G_{1st}$ represents a first conductor, $L_{2nd}$ represents a second inductor, $L_{self}$ represents self inductance per unit distance, $L_m$ represents inductance per unit distance, $R_{2nd}$ represents a first register, $R_{self}$ represents self resistance per unit distance, and $R_m$ represents resistance per unit distance.

8. The modeling circuit of claim 7, wherein the higher order resonant circuit block is arranged between the second circuit block and the second port and coupled in series with the second circuit block and the second port, the second inductor and the second register are coupled in series with each other, and the second inductor and the second register, the second capacitor, and the second conductor are arranged between the second circuit block and the second port and coupled in parallel with each other.

9. The modeling circuit of claim 8, wherein the capacitance per unit distance is calculated on the basis of Equation: $C_m = C_{1st}/lN$, the conductance per unit distance is calculated on the basis of Equation: $G_m = G_{1st}/lN$, the self resistance per unit distance is calculated on the basis of Equation: $R_{self} = (6N/l)R_{2nd}$, the inductance per unit distance is calculated on the basis of Equation:

$$L_m = L_{self} - \frac{6N}{l} L_{2nd},$$

the equivalent resistance of the terminations is basis of Equation:

$$R_T = \frac{1}{2}\left\{ R_{1st} - \left(\frac{l}{2N} + \frac{4l'}{N}\right) R_{self} \right\},$$

and the equivalent inductance of the terminations is calculated on the basis of Equation:

$$L_T = \frac{L_{1st}}{2} + \frac{3}{2}L_{2nd} - \left(\frac{l + 4l'}{2N}\right) L_{self},$$

wherein, $C_{1st}$ represents a first capacitor, $C_m$ represents capacitance per unit distance, l represents a length of an overlap zone, N represents the layer number of stacked electrodes, $G_{1st}$ represents a first conductor, $G_m$ represents conductance per unit distance, $R_{self}$ represents self resistance per unit distance, $R_{2nd}$ represents a second register, $L_{2nd}$ represents a second inductor, $L_{self}$ represents self inductance per unit distance, $L_m$ represents inductance per unit distance, $L_T$ represents equivalent inductance of the terminations, l' represents a length of a non-overlap zone, and $R_T$ represents equivalent resistance of the terminations.

10. A method for modeling a high-frequency device that comprises an overlap zone where the two electrodes are overlapped with each other, a non-overlap zone where the overlap zone is absent between the two electrodes, the overlap and non-overlap zones being formed by stacking two or more electrodes on top of each other in a constant distance, and terminations electrically coupled with some parts of the two electrodes, comprising:

modeling the overlap zone of the high-frequency device on the basis of coupled transmission line theory, and the non-overlap zone and the terminations of the high-frequency device on the basis of a Series RL model; and extracting each parameter of the modeled circuits from actually measured self resonance frequency of the high-frequency device to substitute the each parameter to the modeled circuits.

11. The method of claim 10, wherein the step of modeling the overlap zone, the non-overlap zone and the terminations of the high-frequency device comprises:

modeling, at a first circuit block comprising a first capacitor and a first conductor, the overlap zone of the high-frequency device on the basis of coupled transmission line theory; and modeling, at a second circuit block comprising a first inductor and a first register, the overlap zone of the high-frequency device on the basis of coupled transmission line theory and the non-overlap zone and the terminations on the basis of a Series RL model.

12. The method of claim 11, wherein the first capacitor is formed on the basis of Equation: $C_{1st} = C_m lN$, the first conductor is formed on the basis of Equation: $G_{1st} = G_m lN$, the first inductor is formed on the basis of Equation:

$$L_{1st} = \frac{l}{2N}(L_{self} + L_m) + \left(\frac{4l'}{N} L_{self} + 2L_T\right),$$

and the first register is formed on the basis of Equation:

$$R_{1st} = \frac{l}{2N}(R_{self} + R_m) + \left(\frac{4l'}{N} R_{self} + 2R_T\right),$$

wherein, $C_{1st}$ represents a first capacitor, $C_m$ represents a capacitance per unit distance, l represents a length of an overlap zone, N represents the layer number of stacked electrodes, $G_{1st}$ represents a first conductor, $G_m$ represents conductance per unit distance, $L_{1st}$ represents a first inductor, $L_{self}$ represents self inductance per unit distance, $L_m$ represents inductance per unit distance, $L_T$ represents, equivalent inductance of the terminations, l' represents a length of a non-overlap zone, $R_{1st}$ represents a first register, $R_{self}$ represents self resistance per unit distance, $R_m$ represents resistance per unit distance, and $R_T$ represents equivalent resistance of the terminations.

13. The method of claim 11, wherein the high-frequency device is mounted on a printed circuit board, the printed circuit board comprises a signal transmission line having the high-frequency device mounted on one surface thereof and a ground pattern formed in the other surface that is opposite to the one surface thereof, and the modeling circuit further comprises first and second substrate circuit blocks that model a parasitic admittance between the high-frequency device and the printed circuit board, the step of modeling the overlap zone, the non-overlap zone and the terminations of the high-frequency device further comprises: modeling first and second substrate circuit blocks each having a parasitic admittance between the high-frequency device and the printed circuit board.

14. The method of claim 13, wherein the step of modeling first and second substrate circuit blocks further comprises: modeling a higher order resonant circuit block having impedance that models the overlap zone of the high-frequency device on the basis of coupled transmission line theory and forms a second or higher self resonance of the high-frequency device.

15. The method of claim 14, wherein the higher order resonant circuit block a second capacitor formed on the basis of Equation: $C_{2nd} = 2C_m lN = 2C_{1st}$;

a second conductor formed on the basis of Equation: $G_{2nd} = 2G_m lN = 2G_{1st}$;

a second inductor formed on the basis of Equation:

$$L_{2nd} = \frac{l}{6N}(L_{self} - L_m);$$

and a second register formed on the basis of Equation:

$$R_{2nd} = \frac{l}{6N}(R_{self} - R_m),$$

wherein, $C_{2nd}$ represents a second capacitor, $C_m$ represents capacitance per unit distance, l represents a length of an overlap zone, N represents the layer number of stacked electrodes, $C_{1st}$ represents a first capacitor, $G_{2nd}$ represents a second conductor, $G_m$ represents conductance per unit distance, $G_{1st}$ represents a first conductor, $L_{2nd}$ represents a second inductor, $L_{self}$ represents self inductance per unit distance, $L_m$ represents inductance per unit distance, $R_{2nd}$ represents a first register, $R_{self}$ represents self resistance per unit distance, and $R_m$ represents resistance per unit distance.

16. The method of claim 15, wherein the capacitance per unit distance is calculated on the basis of Equation: $C_m = C_{1st}/lN$, the conductance per unit distance is calculated on the basis of Equation: $G_m = G_{1st}/lN$, the self resistance per unit distance is calculated on the basis of Equation: $R_{self} = (6N/l)R_{2nd}$, the inductance per unit distance is calculated on the basis of Equation:

$$L_m = L_{self} - \frac{6N}{l}L_{2nd},$$

the equivalent resistance of the terminations is calculated on the basis of Equation:

$$R_T = \frac{1}{2}\left\{R_{1st} - \left(\frac{l}{2N} + \frac{4l'}{N}\right)R_{self}\right\},$$

and the equivalent inductance of the terminations is calculated on the basis of Equation:

$$L_T = \frac{L_{1st}}{2} + \frac{3}{2}L_{2nd} - \left(\frac{l + 4l'}{2N}\right)L_{self},$$

wherein, $C_{1st}$ represents a first capacitor, $C_m$ represents capacitance per unit distance, l represents a length of an overlap zone, N represents the layer number of stacked electrodes, $G_{1st}$ represents a first conductor, $G_m$ represents conductance per unit distance, $R_{self}$ represents self resistance per unit distance, $R_{2nd}$ represents a second register, $L_{2nd}$ represents a second inductor, $L_{self}$ represents self inductance per unit distance, $L_m$ represents inductance per unit distance, $L_T$ represents equivalent inductance of the terminations, l' represents a length of a non-overlap zone, and $R_T$ represents equivalent resistance of the terminations.

* * * * *